US012754270B2

(12) United States Patent
Fan et al.

(10) Patent No.: US 12,754,270 B2
(45) Date of Patent: Oct. 6, 2026

(54) INTERLEAVED FLOW-SENSITIVE DEPHASING (IFSD) FOR ENHANCED BLOOD FLOW SUPPRESSION AND PRESERVED T1-WEIGHTED CONTRAST AND OVERALL SIGNAL INTENSITY IN 3D TURBO SPIN-ECHO IMAGING

(71) Applicant: University of Southern California, Los Angeles, CA (US)

(72) Inventors: Zhaoyang Fan, Los Angeles, CA (US); Qingle Kong, Los Angeles, CA (US)

(73) Assignee: UNIVERSITY OF SOUTHERN CALIFORNIA, Los Angeles, CA (US)

( * ) Notice: Subject to any disclaimer, the term of this patent is extended or adjusted under 35 U.S.C. 154(b) by 131 days.

(21) Appl. No.: 18/775,907

(22) Filed: Jul. 17, 2024

(65) Prior Publication Data

US 2025/0067828 A1 Feb. 27, 2025

Related U.S. Application Data

(60) Provisional application No. 63/533,848, filed on Aug. 21, 2023.

(51) Int. Cl.
*G01R 33/561* (2006.01)
*G01R 33/56* (2006.01)

(52) U.S. Cl.
CPC ..... *G01R 33/5617* (2013.01); *G01R 33/5602* (2013.01); *G01R 33/5607* (2013.01)

(58) Field of Classification Search
CPC ............ G01R 33/5617; G01R 33/5602; G01R 33/5607; G01R 33/50; G01R 33/448
See application file for complete search history.

(56) References Cited

U.S. PATENT DOCUMENTS 5,570,019 A * 10/1996 Moonen ............ G01R 33/4833 324/309
6,380,739 B1 * 4/2002 Machida ............. G01R 33/563 324/309

FOREIGN PATENT DOCUMENTS

WO WO-2011049403 A2 * 4/2011 ......... G01R 33/5617

* cited by examiner

*Primary Examiner* — Rishi R Patel
(74) *Attorney, Agent, or Firm* — Snell & Wilmer LLP

(57) ABSTRACT

Systems, computer-readable medium, methods and apparatus, and/or devices are provided interleaved flow-sensitive dephasing. The disclosed dephasing enhances flow-suppression capability that makes 3D T1-weighted turbo-spin echo (TSE) imaging useful for brain metastasis detection and intracranial vessel wall and venous sinus imaging. The disclosed mechanisms suppress residual flow artifacts mimicking pathological features, while maintaining signal quality and T-1 weighted contrast, maintaining the diagnostic performance of 3D TSE.

11 Claims, 14 Drawing Sheets

INTERLEAVED FLOW-SENSITIVE DEPHASING (IFSD) FOR ENHANCED BLOOD FLOW SUPPRESSION AND PRESERVED T1-WEIGHTED CONTRAST AND OVERALL SIGNAL INTENSITY IN 3D TURBO SPIN-ECHO IMAGING

CROSS REFERENCE TO RELATED APPLICATIONS

This application is based upon and claims the benefit of and priority to U.S. Provisional Application No. 63/533,848 entitled "INTERLEAVED FLOW-SENSITIVE DEPHASING (IFSD) FOR ENHANCED BLOOD FLOW SUPPRESSION AND PRESERVED T1-WEIGHTED CONTRAST AND OVERALL SIGNAL INTENSITY IN 3D TURBO SPIN-ECHO IMAGING," filed on Aug. 21, 2023, the entire content of which is incorporated by reference herein.

STATEMENT AS TO FEDERALLY SPONSORED RESEARCH

Not applicable.

BACKGROUND

1. Field

The following disclosure relates to medical imaging, and more specifically, to interleaved flow-sensitive dephasing for medical imaging.

2. Description of the Related Art

Medical imaging is useful for brain metastasis detection and intracranial vessel wall imaging and venous sinus imaging. However, residual flow artifacts associated with blood and mimicking pathological features can occur due to insufficient blood flow suppression. Moreover, prior techniques for blood flow suppression may have unwanted effects such as signal reduction and contrast loss, which can limit the diagnostic function of the imaging.

SUMMARY

A method for interleaved flow-sensitive dephasing is provided. The method may include various aspects. For instance, the method may include generating, via a sequence controller and through one or more radio frequency coils, a 90-degree excitation radio frequency pulse. The method may include generating, via the sequence controller and through one or more gradient amplifiers, a first pair of unipolar gradient pulses. The method may include generating, via the sequence controller and through the one or more radio frequency coils, a 180-degree radio frequency pulse. The method may include generating, via the sequence controller and through the one or more gradient amplifiers, a second pair of unipolar gradient pulses. The method may include performing a step of generating, via the sequence controller and through the one or more radio frequency coils, a refocusing radio frequency pulse. The method may include repeating the step of generating the refocusing radio frequency pulse.

In various embodiments, one or more further aspect may be provided. For instance, the first pair of unipolar gradient pulses may be in a phase-encoding direction and a partition-encoding direction. The second pair of unipolar gradient pulses may be in the phase-encoding direction and the partition-encoding direction. One of the first pair of unipolar gradient pulses may be in a negative direction and a second of the first pair of unipolar gradient pulses may be in a positive direction.

The one or more gradient amplifiers may include a first gradient amplifier and a second gradient amplifier. The method may further include toggling, via the sequence controller, at least one of a first polarity of the first gradient amplifier and a second polarity of the second gradient amplifier at each time of repetition in the repeating the step of generating the refocusing radio frequency pulse. In various embodiments, in response to the toggling, a cumulative first-order gradient moment ($m_1$) is exerted in different angles. In various embodiments, the first pair of unipolar gradient pulses are generated closer in time to the 180-degree radio frequency pulse relative to the 90-degree excitation radio frequency pulse. In various embodiments, the second pair of unipolar gradient pulses are generated closer in time to the 180-degree radio frequency pulse relative to a first of the refocusing radio frequency pulse. In various embodiments, the first pair of unipolar gradient pulses are generated between the 90-degree excitation radio frequency pulse and the 180-degree radio frequency pulse, and the second pair of unipolar gradient pulses are generated between the 180-degree radio frequency pulse and the first of the refocusing radio frequency pulse. In various embodiments, the method may include generating an MRI image. The MRI image may be a T1-weighted contrast image.

An article of manufacture is provided. The article may include a tangible, non-transitory computer-readable storage medium (CRM) having instructions stored thereon that, in response to execution by one or more processors, cause the one or more processors to perform operations. The operations may include generating, via the one or more processors and through one or more radio frequency coils, a 90-degree excitation radio frequency pulse. The operations may include generating, via the one or more processors and through one or more gradient amplifiers, a first pair of unipolar gradient pulses. The operations may include generating, via the one or more processors and through the one or more radio frequency coils, a 180-degree radio frequency pulse. The operations may include generating, via the one or more processors and through the one or more gradient amplifiers, a second pair of unipolar gradient pulses. The operations may include performing a step of generating, via the one or more processors and through the one or more radio frequency coils, a refocusing radio frequency pulse. The operations may include repeating, via the one or more processors, the step of generating the refocusing radio frequency pulse.

In various embodiments, one or more further aspect may be provided. For instance, the first pair of unipolar gradient pulses may be in a phase-encoding direction and a partition-encoding direction. The second pair of unipolar gradient pulses may be in the phase-encoding direction and the partition-encoding direction. One of the first pair of unipolar gradient pulses may be in a negative direction and a second of the first pair of unipolar gradient pulses may be in a positive direction.

The one or more gradient amplifiers may include a first gradient amplifier and a second gradient amplifier. The method may further include toggling, via the sequence controller, at least one of a first polarity of the first gradient amplifier and a second polarity of the second gradient amplifier at each time of repetition in the repeating the step of generating the refocusing radio frequency pulse. In various embodiments, in response to the toggling, a first-order gradient moment ($m_1$) is exerted in different angles. In various embodiments, the first pair of unipolar gradient pulses are generated closer in time to the 180-degree radio frequency pulse relative to the 90-degree excitation radio frequency pulse. In various embodiments, the second pair of unipolar gradient pulses are generated closer in time to the 180-degree radio frequency pulse relative to a first of the refocusing radio frequency pulse. In various embodiments, the first pair of unipolar gradient pulses are generated between the 90-degree excitation radio frequency pulse and the 180-degree radio frequency pulse, and the second pair of unipolar gradient pulses are generated between the 180-degree radio frequency pulse and the first of the refocusing radio frequency pulse. In various embodiments, the method may include generating an MRI image. The MRI image may be a T1-weighted contrast image.

A system may be provided. The system may include a magnetic resonance imaging (MRI) scanner. The system may include a computing apparatus having a sequence controller in electronic communication with the MRI scanner. The computing apparatus having the sequence controller may be configured to perform various aspects of a method. The method may include generating, through one or more radio frequency coils of the MRI scanner, a 90-degree excitation radio frequency pulse. The method may include generating, through one or more gradient amplifiers of the MRI scanner, a first pair of unipolar gradient pulses. The method may include generating, through the one or more radio frequency coils of the MRI scanner, a 180-degree radio frequency pulse. The method may include generating, through the one or more gradient amplifiers of the MRI scanner, a second pair of unipolar gradient pulses. The method may include performing a step of generating, through the one or more radio frequency coils of the MRI scanner, a refocusing radio frequency pulse. The method may include repeating the step of generating the refocusing radio frequency pulse.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the following illustrative figures. In the following figures, like reference numbers refer to similar elements and steps throughout the figures.

DETAILED DESCRIPTION

Flow-suppression capability makes 3D T1-weighted turbo-spin echo (TSE) imaging useful for brain metastasis detection and intracranial vessel wall and venous sinus imaging. However, the "black-blood" (BB) property is more effective for relatively fast flow and when blood vessels are parallel to the readout direction. Residual flow artifacts mimicking pathological features can happen due to insufficient blood flow suppression when these conditions are not met. Additional blood-suppression techniques can suppress such artifactual flow, including delay alternating with nutation for tailored excitation (DANTE) and motion-sensitized driven equilibrium (MSDE). However, both these technologies result in signal reduction and loss of T1-weighted contrast, which can limit the diagnostic performance of 3D TSE. This disclosure recites an interleaved flow-sensitive dephasing (iFSD) scheme and incorporates it into the T1-weighted TSE sequence (e.g., SPACE by Siemens) to improve its black blood effect, preserve T1-weighted contrast, and reduce signal-to-noise ratio (SNR) penalty. A system, apparatus and/or method for interleaved flow-sensitive dephasing (iFSD) for enhanced blood flow suppression and preserved T1-weighted contrast and overall signal intensity in 3D turbo spin-echo imaging is disclosed herein.

Figure 1A:
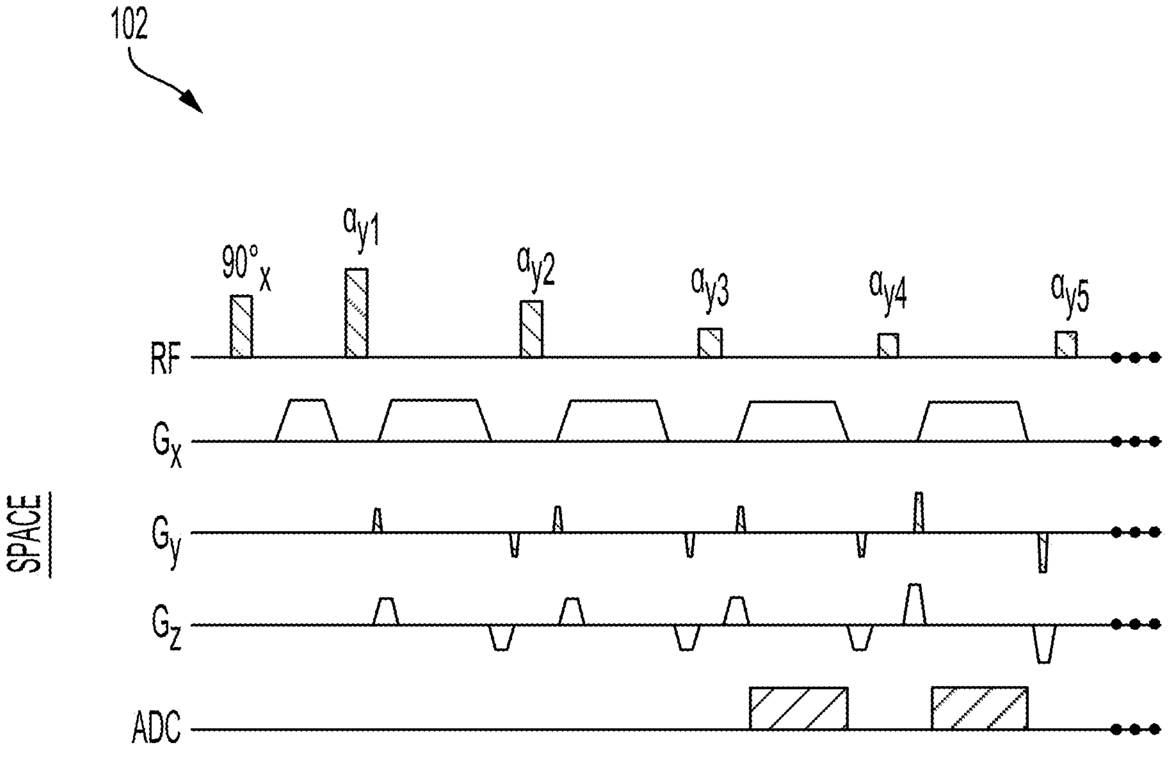
FIG. 1A illustrates a sequence diagram of a conventional T1-weighted SPACE sequence, in accordance with various embodiments.
Figure 1B:
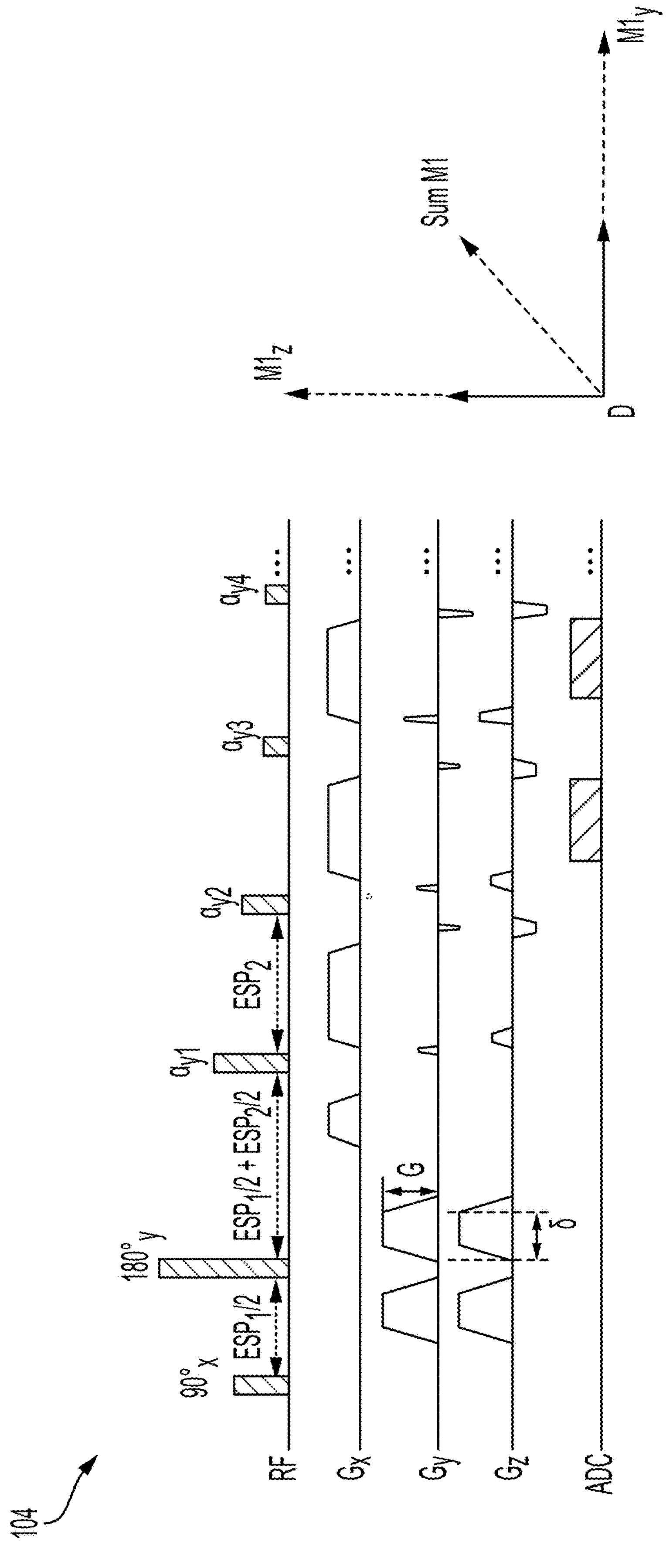
FIGS. 1B-C illustrates a proposed iFSD-Space sequence with cumulated $M_1$ in different angles, in accordance with various embodiments.
Figure 1C:
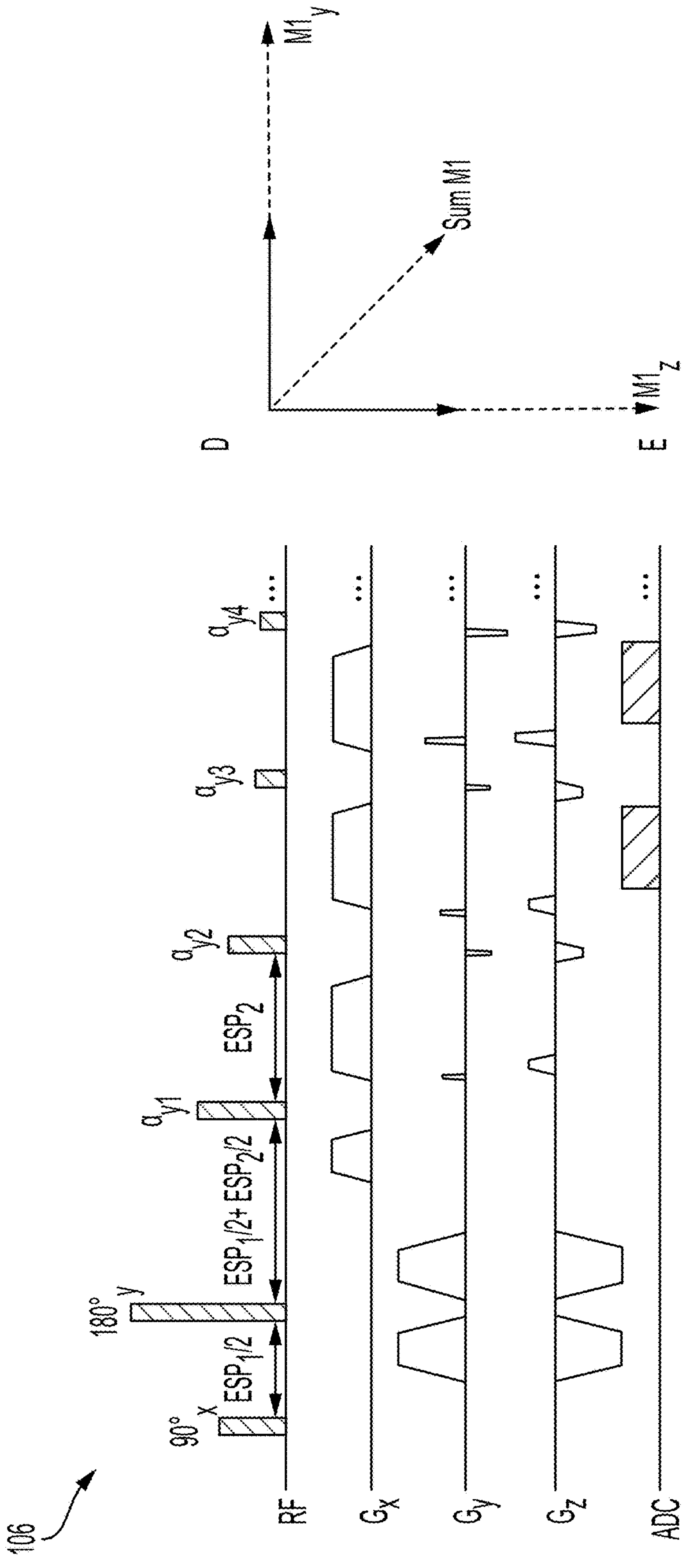

With reference to FIGS. 1A-1C, the iFSD approach includes an MR sequence modification in SPACE: 1) adding a 180-degree RF pulse between the 90-degree excitation RF pulse and the originally first refocusing RF pulse, 2) adding a pair of unipolar FSD gradient pulses around the 180-degree RF pulse in the phase-encoding and partition-encoding directions to exert the first-order gradient moment ($m_1$), and 3) the polarity of FSD gradients in the partition direction (or the phase-encoding direction) is toggled every time of repetition (TR) to exert cumulative $m_1$ in different angles, such as in orthogonal angles. The iFSD gradient was optimized to achieve the best $m_1$ for the balance of blood suppression and T1-weighted contrast. FIG. 1A illustrates a sequence diagram 102 of a conventional T1-weighted SPACE sequence. FIG. 1B illustrates a sequence diagram 104 of a proposed FSD-Space sequence. FIGS. 1B-1C illustrate a sequence diagram 104 and a further sequence diagram 106 of a proposed iFSD-Space sequence. Cumulative $m_1$ in different angles for the interleaved toggling of FSD gradient polarity is also shown.

Figure 2:
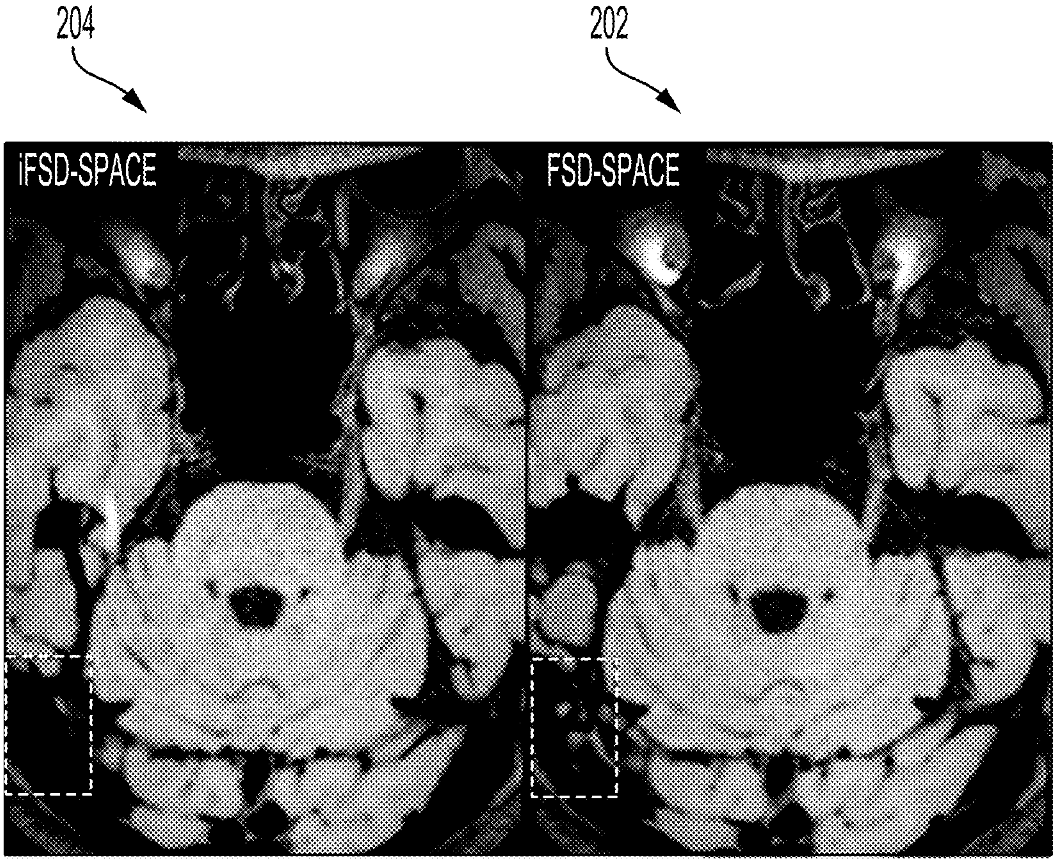
FIG. 2 illustrates various imaging outcomes, in accordance with various embodiments.

FIG. 2 illustrates various imaging outcomes. For instance, diagram 202 illustrates blood suppression in a FSD scheme in a left transverse sinus and diagram 204 illustrates blood suppression in an iFSD scheme in the left transverse sinus. As viewed side-by-side, one may appreciate the improved blood flow suppression illustrated in an iFSD scheme.

Figure 3:
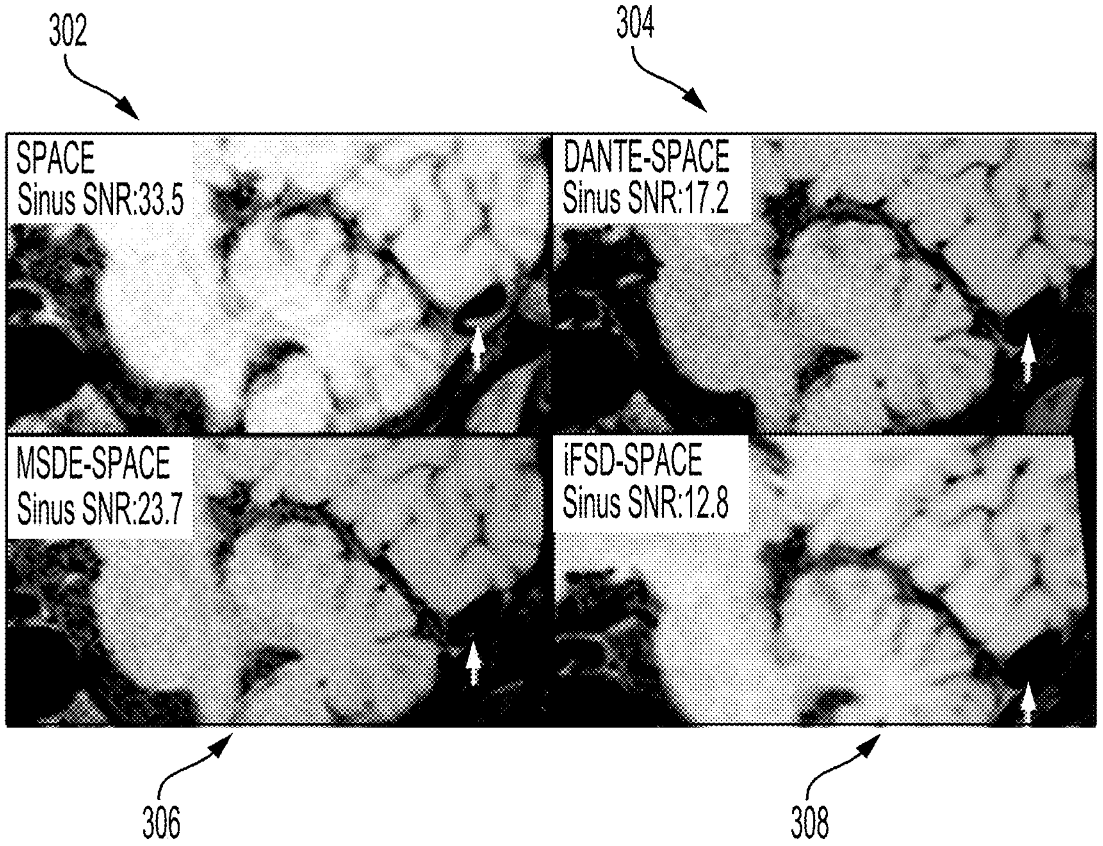
FIG. 3 illustrates a comparison of blood suppression effects among different mechanisms in the sagittal sinus as illustrated by corresponding arrows, in accordance with various embodiments.

FIG. 3 illustrates a comparison of blood suppression effects among different mechanisms in the sagittal sinus as illustrated by the corresponding arrow. FIG. 3 illustrates a diagram 302 in a SPACE scheme, a diagram 304 in a DANTE-Space scheme, a diagram 306 in an MSDE-Space scheme, and a diagram 208 in an iFSD-Space scheme. In this comparison, a sagittal sinus liminal was chosen because of the slower blood velocity and more easily emerging residual blood signal. As shown, iFSD-Space has comparable blood suppression to other indicated mechanisms.

Figure 4:
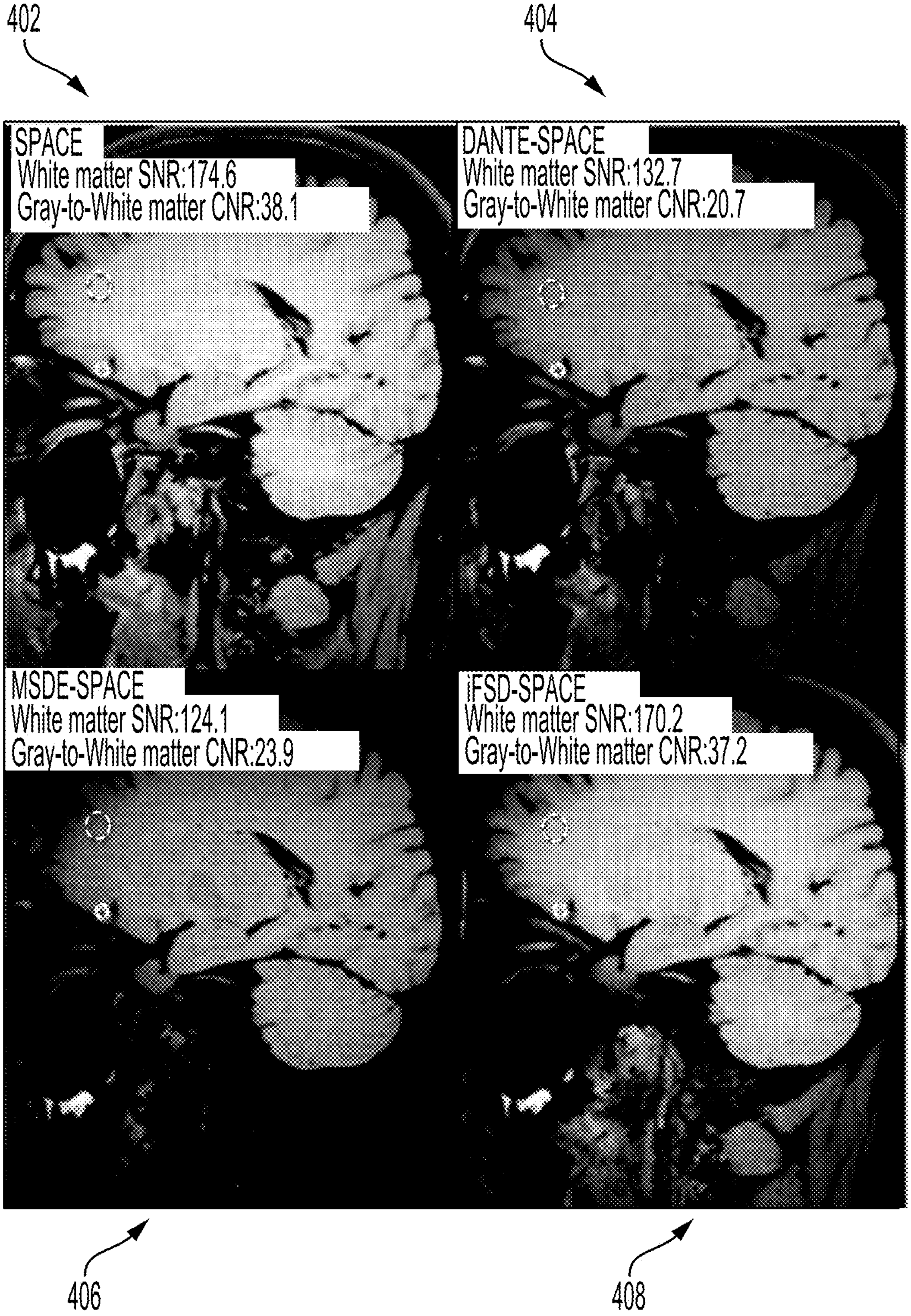
FIG. 4 shows diagrams of comparison of grey-to-white matter contrast-to-noise ratio and white matter signal-to-noise ratio among a diagram in a SPACE scheme, a diagram in a DANTE-Space scheme, a diagram in a MSDE-Space scheme, and a diagram in an iFSD-Space scheme, in accordance with various embodiments.

FIG. 4 illustrates that iFSD-Space has superior T1-weighted contrast and overall SNR relative to the other illustrated mechanisms. FIG. 4 shows diagrams of comparison of grey-to-white matter contrast-to-noise ratio and white matter signal-to-noise ratio among a diagram 402 in a SPACE scheme, a diagram 404 in a DANTE-Space scheme, a diagram 406 in a MSDE-Space scheme, and a diagram 408 in an iFSD-Space scheme.

Figure 5:
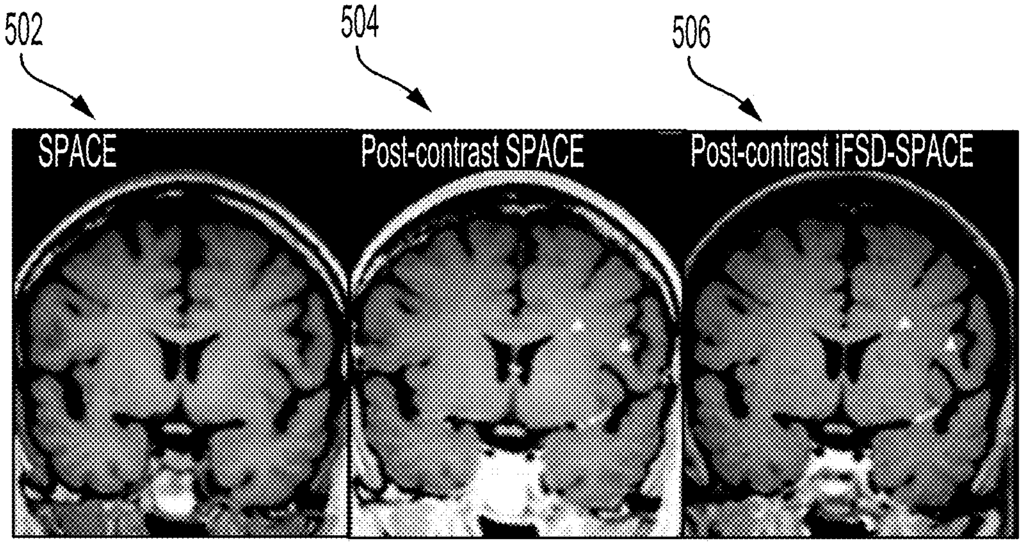
FIG. 5 illustrates an iFSD-Space mechanism effectively suppressing slow flow signals in small veins post-contrast injection, avoiding misdiagnosis, in accordance with various embodiments.

FIG. 5 illustrates an iFSD-Space mechanism effectively suppressing slow flow signals in small veins post-contrast injection, avoiding misdiagnosis. A diagram 502 showing a scan using a SPACE mechanism is depicted. A diagram 504 showing a scan depicting a post-contrast SPACE mechanism is shown. A diagram 506 showing a scan depicting a post-contrast iFSD-SPACE mechanism is shown. Focal enhancement along the lateral wall of the left middle cerebral artery (MCA) on a coronal post-contrast SPACE scan cannot be distinguished from the arterial wall, raising suspicions for plaque. Post-contrast enhanced iFSD-Space shows a patent lumen of a small vein near the MCA. Slow-flow artifacts from small veins observed on post-contrast SPACE also raise suspicion for brain metastasis, which is not observed in post-contrast iFSD-Space.

Figure 6:
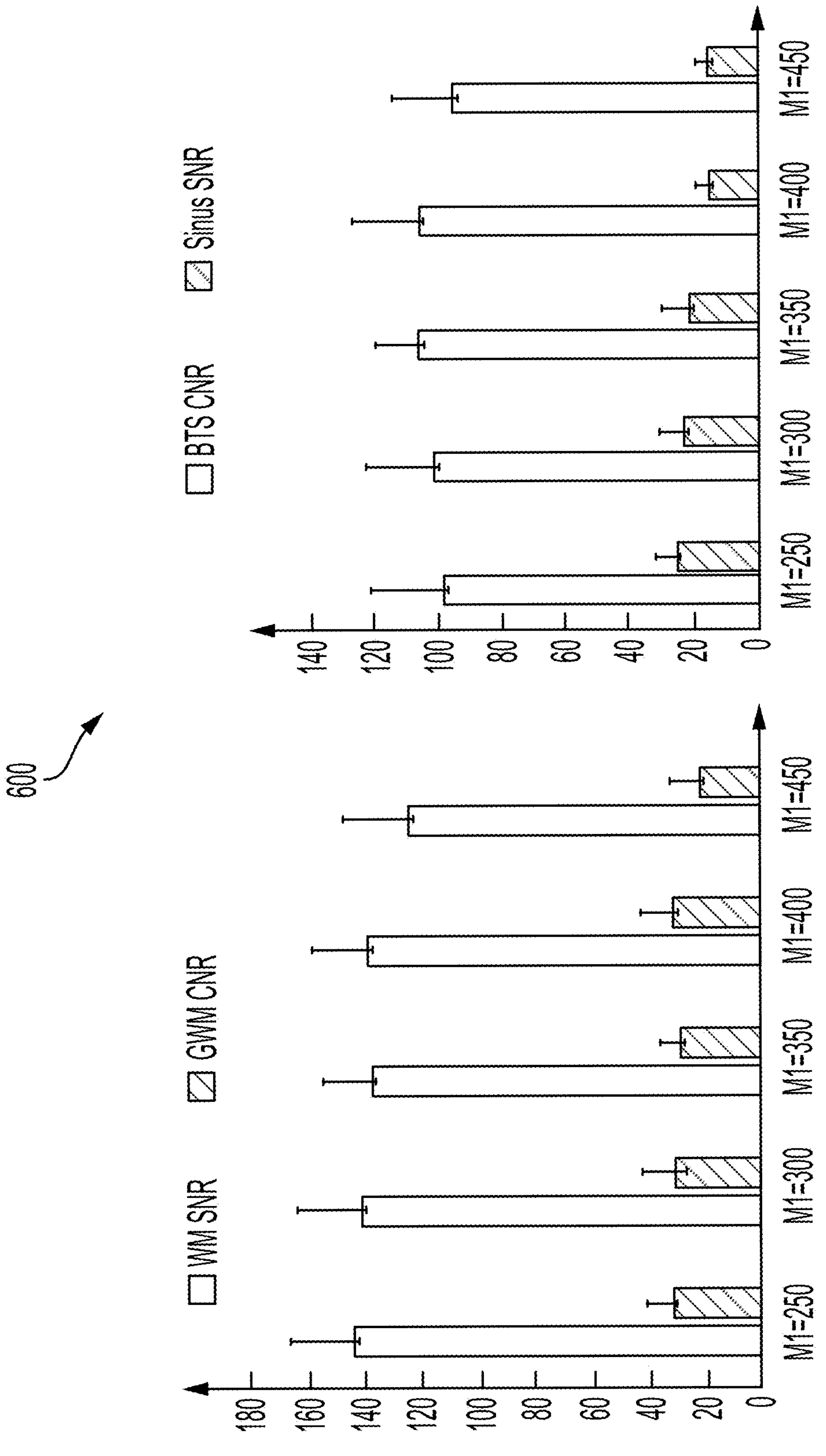
FIG. 6 provides a diagram of graphs illustrating an optimized iFSD gradient to achieve a best $m_1$ for the balance of blood suppression and T1-weighted contrast, in accordance with various embodiments.

Continuing now with reference to FIG. 6, in 5 healthy subjects, FSD gradient pulses were optimized to achieve the best $m_1$ for the balance among blood flow suppression (measured by venous sinus SNR and brain tissue-to-sinus [BTS] CNR), T1-weighted contrast (measured by gray-to-white matter [GWM] CNR), and overall signals (measured by white-matter [WM] SNR). Additionally, the optimized iFSD-SPACE is compared with DANTE-SPACE and MSDE-SPACE as well as SPACE with non-interleaved FSD in these subjects and one stroke patient.

Figure 7:
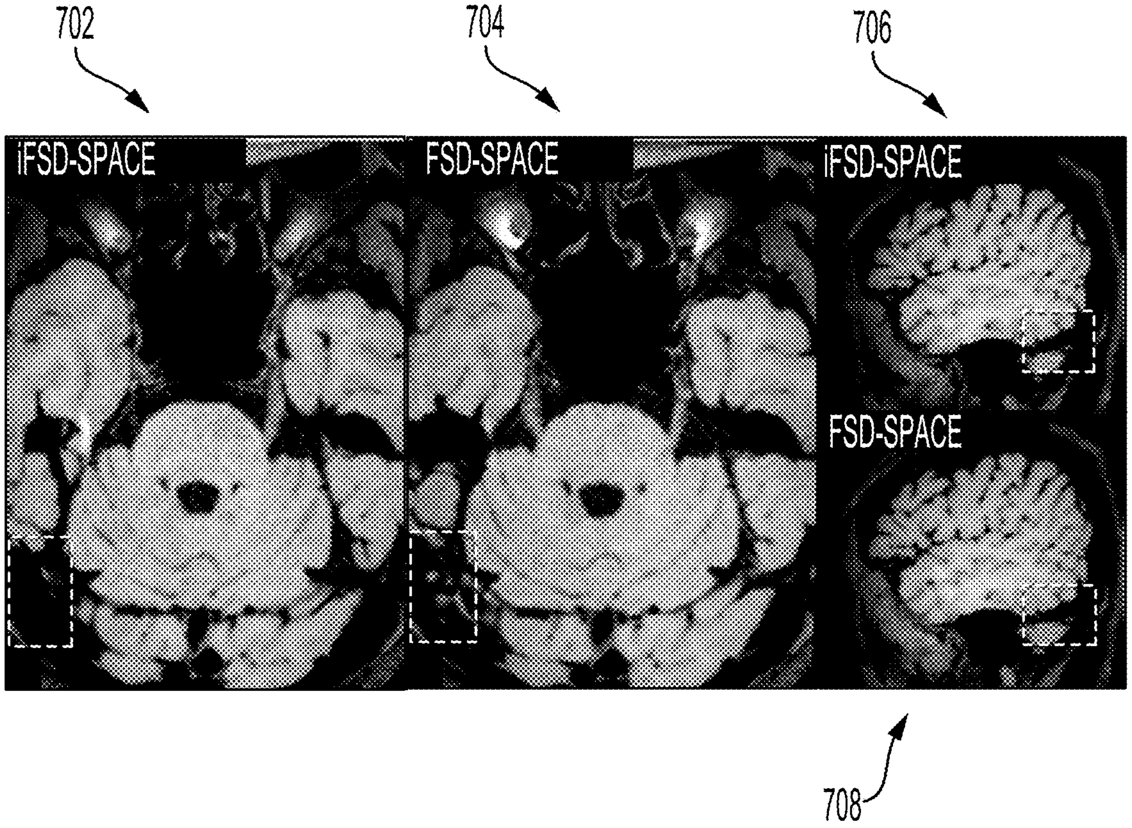
FIG. 7 illustrates that the iFSD scheme achieves more complete blood flow suppression than the non-interleaved FSD scheme at the vessels perpendicular to the direction of the vector sum of simultaneously applied FSD gradients, in accordance with various embodiments.

The best $m_1$ was chosen as 400 mT ms$^2$/m per axis (FIG. 6). The iFSD scheme achieves more complete blood flow suppression than the non-interleaved FSD scheme at the vessels perpendicular to the direction of the vector sum of simultaneously applied FSD gradients (FIG. 7). There is no obvious difference in sinus SNR among DANTE-Space, MSDE-Space, and iFSD-Space, suggesting comparable flow-suppression performance (FIGS. 8-9). iFSD-Space had the best BTS CNR (98.5±8.8) among the four sequences (SPACE (66.7±22.1), DANTE-Space (74.5±9.3), MSDE-Space (72.5±3.7)). SPACE yielded the highest GWR CNR (39.8±1.6) followed by iFSD-Space (31.9±5.5) and DANTE-Space (22±1.4), and MSDE-Space yields the worst GWR CNR (20.1±3.3), indicating that iFSD-Space was capable of preserving T1-weighted contrast. iFSD-Space yielded WM SNR (143.3±23.3) that was comparable to that of SPACE (154.2±18.5) but much higher than those of DANTE-Space (117±13.6) and MSDE-Space (112±10.5). The use of iFSD help avoid the misinterpretation of small vein blood flow artifacts as enhanced plaques (FIG. 10).

Turning now to a further discussion of the briefly mentioned figures, FIG. 6 provides a diagram 600 of graphs illustrating an optimized iFSD gradient to achieve a best $m_1$ for the balance of blood suppression and T1-weighted contrast. Abbreviations used in the Figure include WM for white matter, GWM for gray-to-white matter, and BTS for brain tissue to sinus. FIG. 7 illustrates comparisons of blood flow suppression between FSD and iFSD schemes in the left transverse venous sinus of a healthy volunteer. A transverse view 702 in an iFSD-SPACE scheme is shown. A transverse view 704 in an FSD-SPACE scheme is shown. A sagittal view 706 in the iFSD-SPACE scheme is shown. A sagittal view 708 in the FSD-SPACE scheme is shown. Both transverse and sagittal views show better blood flow suppression of this segment perpendicular to the vector sum of FSD gradients.

Figure 8:
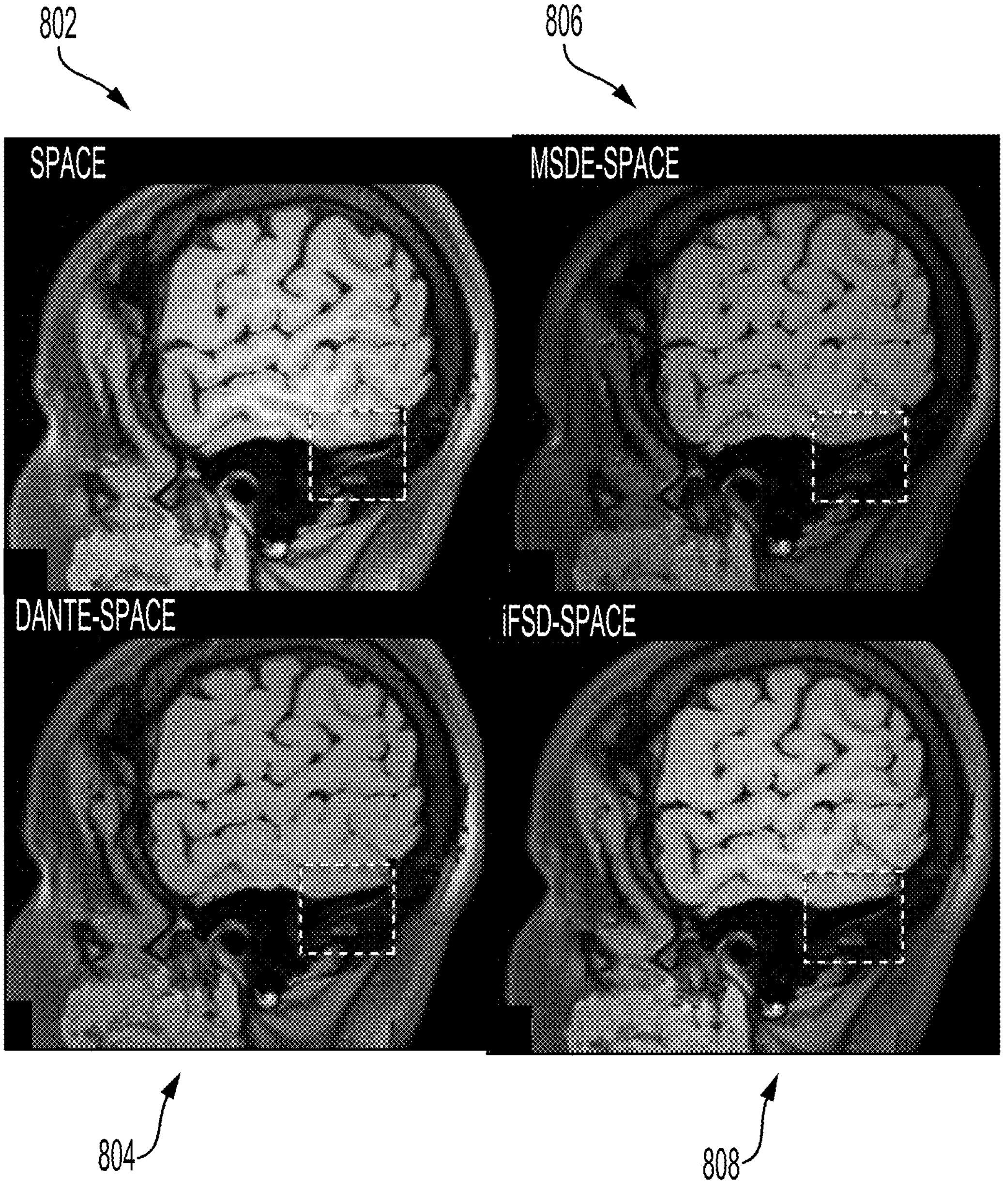
FIG. 8 illustrates representative images among SPACE, DANTE-Space, MSDE-Space, and iFSD-Space in the left transverse sinus, in accordance with various embodiments.
Figure 9:
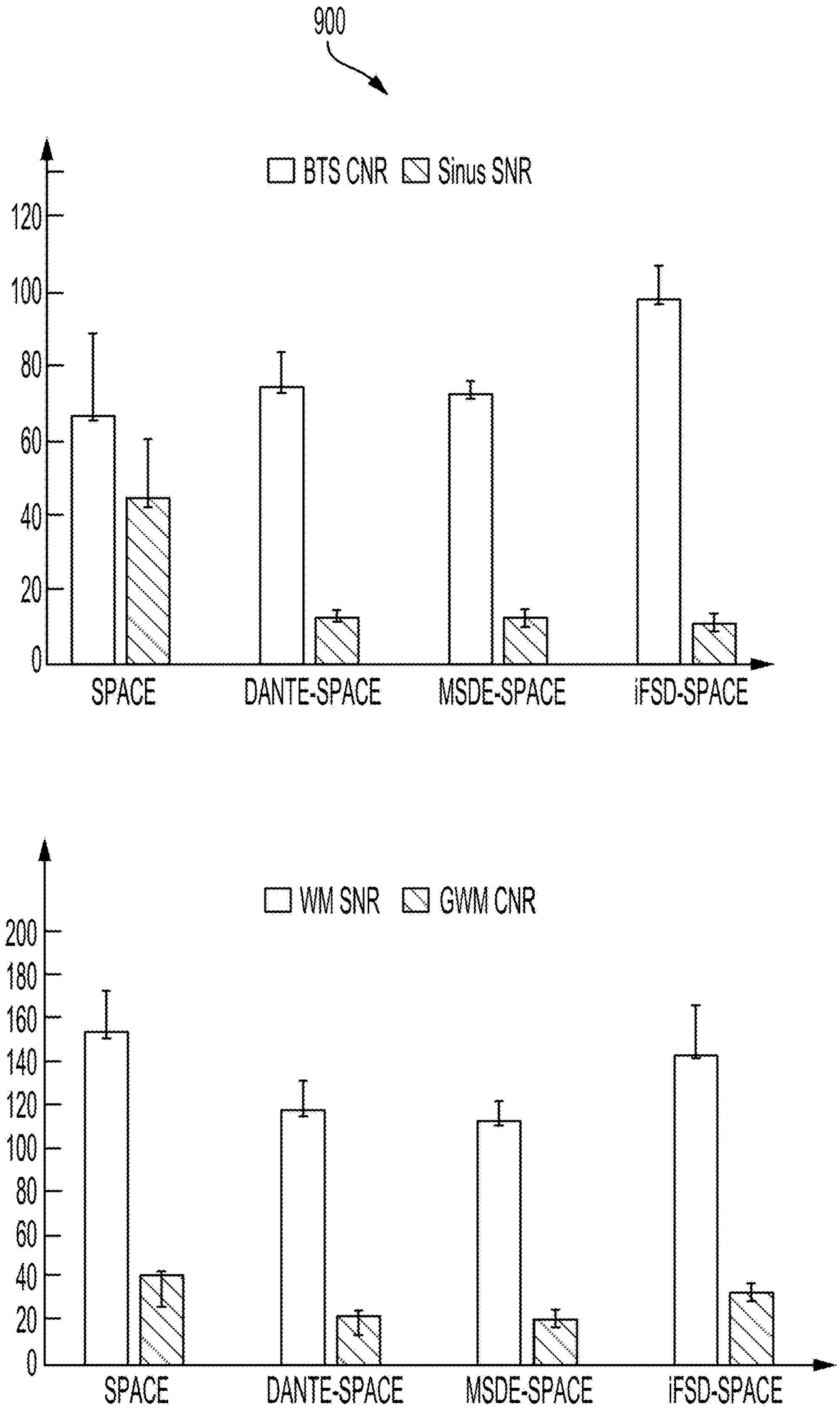
FIG. 9 illustrates a diagram of quantitative comparisons among the same aspects illustrated in FIG. 8, in accordance with various embodiments.

FIG. 8 illustrates representative images among SPACE 802, DANTE-Space 804, MSDE-Space 806, and iFSD-Space 808 in the left transverse sinus. Similarly FIG. 9 illustrates a diagram 900 of quantitative comparisons among the same. In FIGS. 8-9, iFSD shows a highest WM SNR and GWR CNR compared to the other two flow-suppression approaches.

Figure 10:
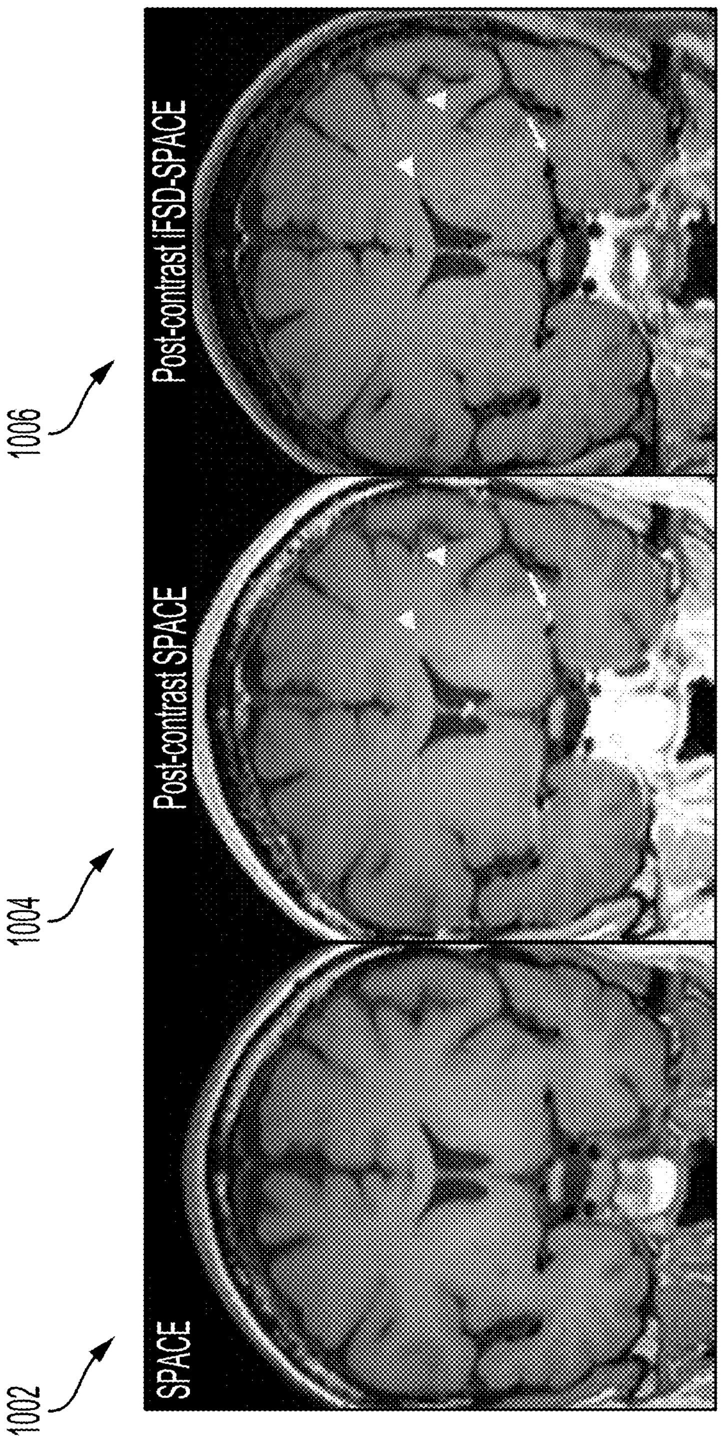
FIG. 10 illustrates use of iFSD to avoid misinterpretation of small vein blood flow artifacts as enhanced plaques, in accordance with various embodiments, in accordance with various embodiments.

FIG. 10 illustrates images of a 63-year-old stroke patient. iFSD suppresses slow flow signals that otherwise mimic enhanced plaque or brain metastasis. The first image 1002 shows a pre-contrast SPACE image, the second image 1004 shows a post-contrast SPACE image, and the third image 1006 shows a post-contrast iFSD-Space image.

Figure 11:
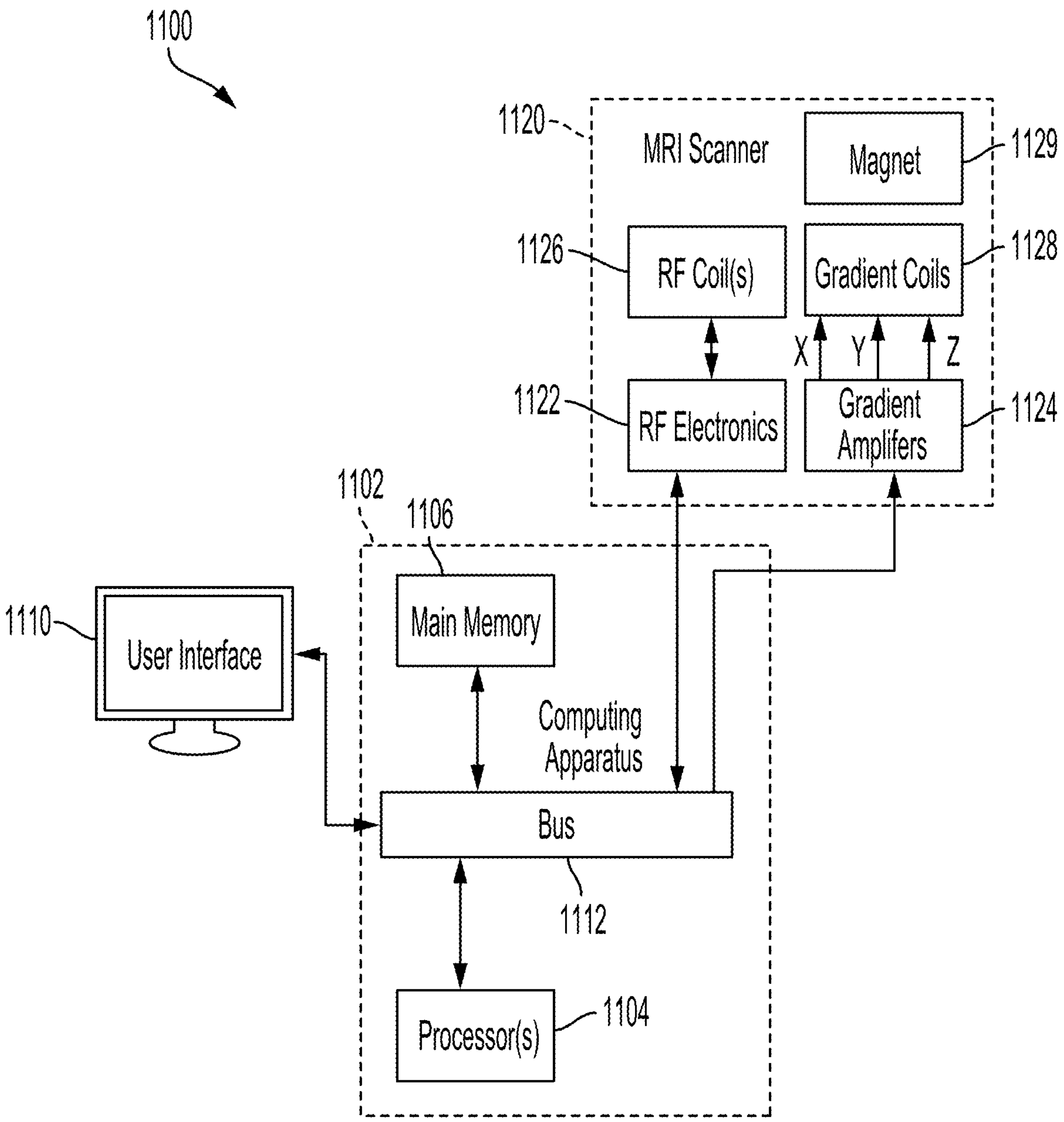
FIG. 11 illustrates a system for improved magnetic resonance imaging, in accordance with various embodiments.

These mechanisms, and principally, an iFSD-Space mechanism may be implemented in a practical machine. Referring now to FIG. 11, a system 1100 for improved magnetic resonance imaging is disclosed herein. The system 1100 (e.g., a computing system) may include a computing apparatus 1102. The computing apparatus 102 may include one or more processors 1104, a memory 1106 and/or a bus 1112 and/or other mechanisms for communicating between the one or more processors 1104. The system 1100 may be a cloud computing system including processors, servers, storage, databases, networking, software, analytics, and/or intelligence accessed or performed over or using the Internet ("the cloud"). The one or more processors 1104 may be implemented as a single processor or as multiple processors. The one or more processors 1104 may execute instructions stored in the memory 1106 to implement the applications and/or detection of the system 1100.

The one or more processors 1104 may be coupled to the memory 1106. The memory 1106 may include one or more of a Random Access Memory (RAM) or other volatile or non-volatile memory. The memory 1106 may be a non-transitory memory or a data storage device, such as a hard disk drive, a solid-state disk drive, a hybrid disk drive, or other appropriate data storage, and may further store machine-readable instructions, which may be loaded and executed by the one or more processors 104.

The memory 1106 may include one or more of random-access memory ("RAM"), static memory, cache, flash memory and any other suitable type of storage device or computer readable storage medium, which is used for storing instructions to be executed by the one or more processors 1104. The storage device or the computer readable storage medium may be a read only memory ("ROM"), flash memory, and/or memory card, which may be coupled to a bus 1112 or other communication mechanism. The storage device may be a mass storage device, such as a magnetic disk, optical disk, and/or flash disk that may be directly or indirectly, temporarily, or semi-permanently coupled to the bus 1112 or other communication mechanism and be electrically coupled to some or all the other components within the system 1100 including the memory 1106, the user interface 1110 and/or a communications interface via the bus 1112.

The term "computer-readable medium" is used to define any medium that can store and provide instructions and other data to a processor, particularly where the instructions are to be executed by a processor and/or other peripheral of the processing system. Such medium can include non-volatile storage, volatile storage, and transmission media. Non-volatile storage may be embodied on media such as optical or magnetic disks. Storage may be provided locally and in physical proximity to a processor or remotely, typically by use of network connection. Non-volatile storage may be removable from computing system, as in storage or memory cards or sticks that can be easily connected or disconnected from a computer using a standard interface.

The system 1100 may include a user interface 1110. The user interface 1110 may include an input/output device. The input/output device may receive user input, such as a user interface element, hand-held controller that provides tactile/proprioceptive feedback, a button, a dial, a microphone, a keyboard, or a touch screen, and/or provides output, such as a display, a speaker, an audio and/or visual indicator, or a refreshable braille display. The display may be a computer display, a tablet display, a mobile phone display, an augmented reality display or a virtual reality headset. The display may output or provide a data related to magnetic resonance imaging (e.g., a T1-weighted contrast image or the like).

The user interface 1110 may include an input/output device that receives user input, such as a user interface element, a button, a dial, a microphone, a keyboard, or a touch screen, and/or provides output, such as a display, a speaker, headphones, an audio and/or visual indicator, a device that provides tactile/proprioceptive feedback or a refreshable braille display. The speaker may be used to output audio associated with the audio conference and/or the video conference. The user interface 1110 may receive user input that may include configuration settings for one or more user preferences, such as a selection of joining an audio conference or a video conference when both options are available, for example.

In various embodiments, the system 1100 further comprises a magnetic resonance imaging ("MRI") scanner 1120. In various embodiments, the MRI scanner 1120 comprises radio frequency electronics 1122, one or more gradient amplifiers 1124, one or more radio frequency coils 1126, one or more gradient coils 1128, and a magnet 1129. Although the RF electronics 1122 and the one or more gradient amplifiers 1124 are illustrated as being separate components from the computing apparatus 1102, the present disclosure is not limited in this regard. For example, the RF electronics 1122 and the gradient amplifiers 1124 can be integrated within the computing apparatus 1102 and still be within the scope of this disclosure. In various embodiments, the RF electronics 1122 and/or the one or more gradient amplifiers are electronically coupled to the one or more processors 1104 (e.g., through the bus 1112). Although illustrated as being electrically coupled to the processors 1104 of the system 1100 through bus 1112, the present disclosure is not limited in this regard. For example, the RF electronics 1122 and the gradient amplifiers 1124 can be directly coupled to the one or more processors 1104, electronically coupled to the one or more processors 1104 (e.g., through a communications interface), or the like, and still be within the scope of this disclosure.

In various embodiment a processor in the one or more processors 1104 and the memory 1106 can form a sequence controller. In this regard, the sequence controller can be configured to control a pulse sequence through the RF electronics 1122 and the gradient amplifiers 1124. In various embodiments, a processor in the one or more processors 1104 and the memory 1106 can form an image reconstruction controller. In this regard, the image reconstruction controller can receive data from the RF electronics 1122 of the MRI scanner 1120 and reconstruct MRI images based on the data, in accordance with various embodiments.

In various embodiments, the magnet 1129 produces a magnetic field, which facilitates alignment and achieving equilibrium in the MRI scanner 1120. Gradient coils 1128 enable image encoding in the x, y, and z direction (i.e., the frequency, phase, and slice-encoding directions). The one or more RF coils excite the aligned spins and receives an RF signal back from the sample. In various embodiments, the various components of the MRI scanner 1120 are controllable through the user interface 1110. In various embodiments, sequences described herein can be pre-programmed in the memory 1106, which can be executable by the one or more processors 104 and selectable through the user interface 1110. The present disclosure is not limited in this regard.

Figure 12:
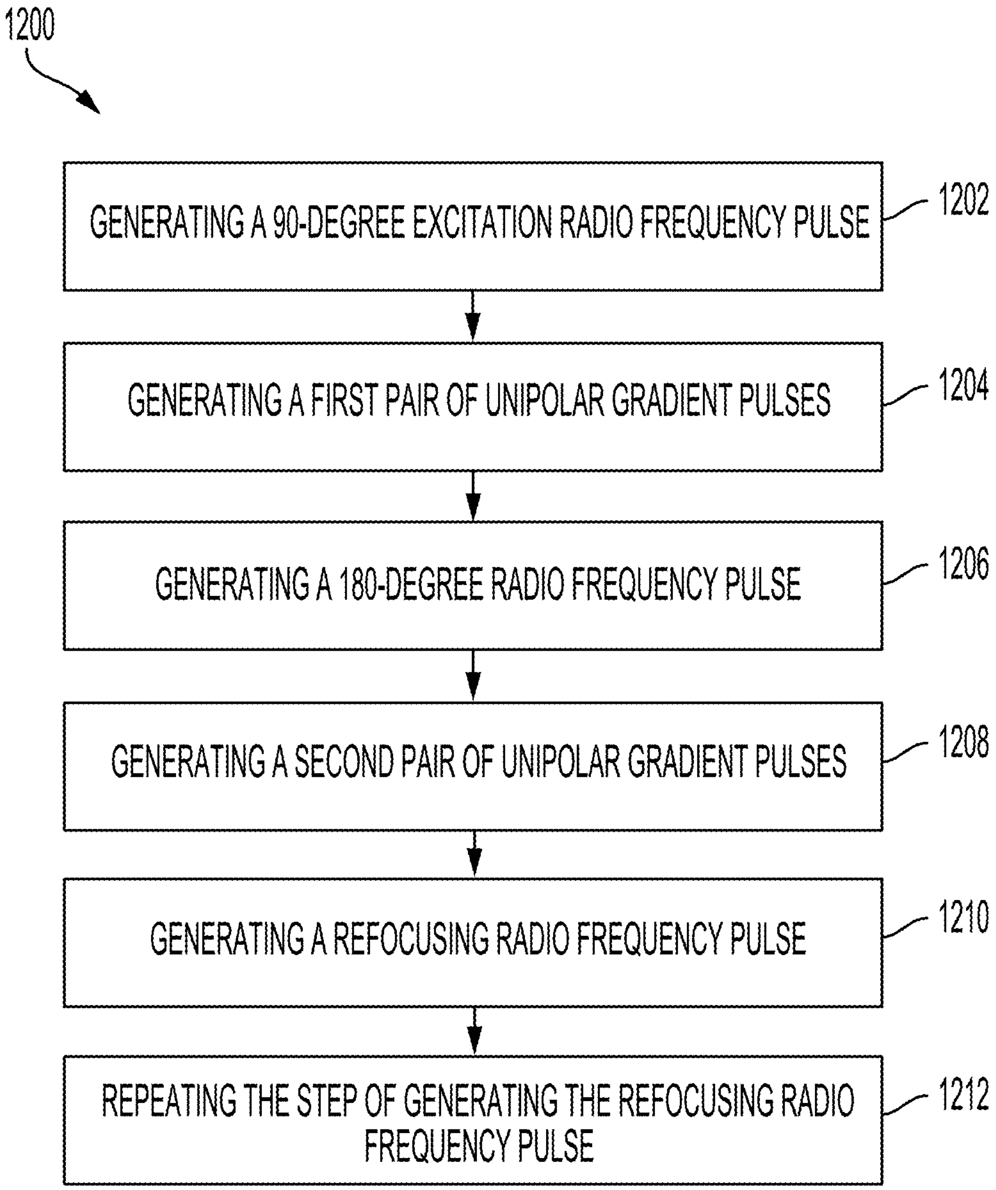
FIG. 12 illustrates a flow chart of a method for interleaved flow-sensitive dephasing, in accordance with various embodiments.

With reference to FIG. 12, a method 1200 is provided. The method may be implemented in connection with any of the concepts discussed herein. Thus, periodic reference to FIGS. 1A-11 may also be helpful while considering the method 1200.

The method 1200 may be a method for interleaved flow-sensitive dephasing. The method may include generating, via a sequence controller and through one or more radio frequency coils, a 90-degree excitation radio frequency pulse (block 1202). The method may include generating, via the sequence controller and through one or more gradient amplifiers, a first pair of unipolar gradient pulses (block 1204). The method may include generating, via the sequence controller and through the one or more radio frequency coils, a 180-degree radio frequency pulse (block 1206). The method may include generating, via the sequence controller and through the one or more gradient amplifiers, a second pair of unipolar gradient pulses (block 1208). The method may include performing a step of generating, via the sequence controller and through the one or more radio frequency coils, a refocusing radio frequency pulse (block 1210). The method may include repeating the step of generating the refocusing radio frequency pulse (block 1212).

In various embodiments, one or more further aspect may be provided. For instance, the first pair of unipolar gradient pulses may be in a phase-encoding direction and a partition-encoding direction. The second pair of unipolar gradient pulses may be in the phase-encoding direction and the partition-encoding direction. One of the first pair of unipolar gradient pulses may be in a negative direction and a second of the first pair of unipolar gradient pulses may be in a positive direction.

With continued reference to the method, but with particular additional reference to FIG. 11, the one or more gradient amplifiers 1124 may include a first gradient amplifier and a second gradient amplifier. The method may further include toggling, via the sequence controller, at least one of a first polarity of the first gradient amplifier and a second polarity of the second gradient amplifier at each time of repetition in the repeating the step of generating the refocusing radio frequency pulse. In various embodiments, in response to the toggling, a first-order gradient moment ($m_1$) is exerted in different angles. In various embodiments, the first pair of unipolar gradient pulses are generated closer in time to the 180-degree radio frequency pulse relative to the 90-degree excitation radio frequency pulse. In various embodiments, the second pair of unipolar gradient pulses are generated closer in time to the 180-degree radio frequency pulse relative to a first of the refocusing radio frequency pulse. In various embodiments, the first pair of unipolar gradient pulses are generated between the 90-degree excitation radio frequency pulse and the 180-degree radio frequency pulse, and the second pair of unipolar gradient pulses are generated between the 180-degree radio frequency pulse and the first of the refocusing radio frequency pulse. In various embodiments, the method may include generating an MRI image. The MRI image may be a T1-weighted contrast image.

Referring now to both FIGS. 11 and 12, one may say that a system 1100 may include a magnetic resonance imaging (MRI) scanner 1120. The system may include a computing apparatus 1102 having a sequence controller in electronic communication with the MRI scanner 1120. The computing apparatus having the sequence controller may be configured to perform various aspects of a method 1200. The method may include generating, through one or more radio frequency coils of the MRI scanner, a 90-degree excitation radio frequency pulse. The method may include generating, through one or more gradient amplifiers of the MRI scanner, a first pair of unipolar gradient pulses. The method may include generating, through the one or more radio frequency coils of the MRI scanner, a 180-degree radio frequency pulse. The method may include generating, through the one or more gradient amplifiers of the MRI scanner, a second pair of unipolar gradient pulses. The method may include performing a step of generating, through the one or more radio frequency coils of the MRI scanner, a refocusing radio frequency pulse. The method may include repeating the step of generating the refocusing radio frequency pulse.

Finally, an article of manufacture is provided. The article may include a tangible, non-transitory computer-readable storage medium (CRM) having instructions stored thereon that, in response to execution by one or more processors, cause the one or more processors to perform operations. The operations may include any or all of those discussed herein above. Moreover, the CRM may be a part of the system of 1100 such as a part of main memory 1106 or may be connectable thereto to load machine instructions into the main memory 1106.

The detailed description of various embodiments herein makes reference to the accompanying drawings, which show various embodiments by way of illustration. While these various embodiments are described in sufficient detail to enable those skilled in the art to practice the disclosure, it should be understood that other embodiments may be realized and that logical chemical, electrical, and mechanical changes may be made without departing from the spirit and scope of the disclosure. Thus, the detailed description herein is presented for purposes of illustration only and not of limitation.

For example, the steps recited in any of the method or process descriptions may be executed in any suitable order and are not necessarily limited to the order presented. Furthermore, any reference to singular includes plural embodiments, and any reference to more than one component or step may include a singular embodiment or step. Also, any reference to attached, fixed, connected, or the like may include permanent, removable, temporary, partial, full, and/or any other possible attachment option. Additionally, any reference to without contact (or similar phrases) may also include reduced contact or minimal contact.

The detailed description of various embodiments herein makes reference to the accompanying drawings and pictures, which show various embodiments by way of illustration. While these various embodiments are described in sufficient detail to enable those skilled in the art to practice the disclosure, it should be understood that other embodiments may be realized, and that logical and mechanical changes may be made without departing from the spirit and scope of the disclosure. Thus, the detailed description herein is presented for purposes of illustration only and not for purposes of limitation.

For example, the steps recited in any of the method or process descriptions may be executed in any order and are not limited to the order presented. Moreover, any of the functions or steps may be outsourced to or performed by one or more third parties. Modifications, additions, or omissions may be made to the systems, apparatuses, and methods described herein without departing from the scope of the disclosure. For example, the components of the systems and apparatuses may be integrated or separated. An individual component may be comprised of two or more smaller components that may provide a similar functionality as the individual component. Moreover, the operations of the systems and apparatuses disclosed herein may be performed by more, fewer, or other components and the methods described may include more, fewer, or other steps. Additionally, steps may be performed in any suitable order. As used in this document, “each” refers to each member of a set or each member of a subset of a set. Furthermore, any reference to singular includes plural embodiments, and any reference to more than one component may include a singular embodiment. Use of ‘a’ or ‘an’ before a noun naming an object shall indicate that the phrase be construed to mean ‘one or more’ unless the context sufficiently indicates otherwise. For example, the description or claims may refer to a processor for convenience, but the invention and claim scope contemplates that the processor may be multiple processors. The multiple processors may handle separate tasks or combine to handle certain tasks. Although specific advantages have been enumerated herein, various embodiments may include some, none, or all of the enumerated advantages. A “processor” may include hardware that runs the computer program code. Specifically, the term ‘processor’ may be synonymous with terms like controller and computer and should be understood to encompass not only computers having different architectures such as single/multi-processor architectures and sequential (Von Neumann)/parallel architectures but also specialized circuits such as field-programmable gate arrays (FPGA), application specific circuits (ASIC), signal processing devices and other devices.

Systems, methods, and computer program products are provided. In the detailed description herein, references to “various embodiments,” “one embodiment,” “an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

The system may allow users and/or electronic devices (collectively, "users") to access data, and receive updated data in real time from other users. The system may store the data (e.g., in a standardized format) in a plurality of storage devices, provide remote access over a network so that users may update the data in a non-standardized format (e.g., dependent on the hardware and software platform used by the user) in real time through a GUI, convert the updated data that was input (e.g., by a user) in a non-standardized form to the standardized format, automatically generate a message (e.g., containing the updated data) whenever the updated data is stored and transmit the message to the users over a computer network in real time, so that the user has immediate access to the up-to-date data. The system allows remote users to share data in real time in a standardized format, regardless of the format (e.g. non-standardized) that the information was input by the user. The system may also include a filtering tool that is remote from the end user and provides customizable filtering features to each end user. The filtering tool may provide customizable filtering by filtering access to the data. The filtering tool may identify data or accounts that communicate with the server and may associate a request for content with the individual account, user, device, etc. The system may include a filter on a local computer and a filter on a server.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the apparatus, methods, and/or articles of manufacture described herein are, for example, capable of operation in other orientations than those illustrated or otherwise described herein.

The terms "couple," "coupled," "couples," "coupling," and the like should be broadly understood and refer to connecting two or more elements mechanically and/or otherwise. Two or more electrical elements may be electrically coupled together, but not be mechanically or otherwise coupled together. Coupling may be for any length of time, e.g., permanent or semi-permanent or only for an instant. "Electrical coupling" and the like should be broadly understood and include electrical coupling of all types. The absence of the word "removably," "removable," and the like near the word "coupled," and the like does not mean that the coupling, etc. in question is or is not removable.

As defined herein, two or more elements are "integral" if they are comprised of the same piece of material. As defined herein, two or more elements are "non-integral" if each is comprised of a different piece of material.

As defined herein, "real-time" can, in some embodiments, be defined with respect to operations carried out as soon as practically possible upon occurrence of a triggering event. A triggering event can include receipt of data necessary to execute a task or to otherwise process information. Because of delays inherent in transmission and/or in computing speeds, the term "real time" encompasses operations that occur in "near" real time or somewhat delayed from a triggering event. In a number of embodiments, "real time" can mean real time less a time delay for processing (e.g., determining) and/or transmitting data. The particular time delay can vary depending on the type and/or amount of the data, the processing speeds of the hardware, the transmission capability of the communication hardware, the transmission distance, etc. However, in many embodiments, the time delay can be less than approximately one second, two seconds, five seconds, or ten seconds.

As defined herein, "approximately" can, in some embodiments, mean within plus or minus ten percent of the stated value. In other embodiments, "approximately" can mean within plus or minus five percent of the stated value. In further embodiments, "approximately" can mean within plus or minus three percent of the stated value. In yet other embodiments, "approximately" can mean within plus or minus one percent of the stated value.

As used herein, "satisfy," "meet," "match," "associated with," or similar phrases may include an identical match, a partial match, meeting certain criteria, matching a subset of data, a correlation, satisfying certain criteria, a correspondence, an association, an algorithmic relationship, and/or the like. Similarly, as used herein, "authenticate" or similar terms may include an exact authentication, a partial authentication, authenticating a subset of data, a correspondence, satisfying certain criteria, an association, an algorithmic relationship, and/or the like.

Terms and phrases similar to "associate" and/or "associating" may include tagging, flagging, correlating, using a look-up table or any other method or system for indicating or creating a relationship between elements. Moreover, the associating may occur at any point, in response to any suitable action, event, or period of time. The associating may occur at pre-determined intervals, periodically, randomly, once, more than once, or in response to a suitable request or action. Any of the information may be distributed and/or accessed via a software enabled link, wherein the link may be sent via an email, text, post, social network input, and/or any other method.

As used herein, "electronic communication" means communication of electronic signals with physical coupling (e.g., "electrical communication" or "electrically coupled") or without physical coupling and via an electromagnetic field (e.g., "inductive communication" or "inductively coupled" or "inductive coupling") and/or a radio frequency (RF) communications protocol. In this regard, "electronic communication," as used herein, includes wired and wireless communications (e.g., Bluetooth, Bluetooth LE, NFC, TCP/IP, Wi-Fi, etc.).

Any databases discussed herein may include relational, hierarchical, graphical, blockchain, object-oriented structure, and/or any other database configurations. Any database may also include a flat file structure wherein data may be stored in a single file in the form of rows and columns, with no structure for indexing and no structural relationships between records. For example, a flat file structure may include a delimited text file, a CSV (comma-separated values) file, and/or any other suitable flat file structure. Common database products that may be used to implement the databases include DB2® by IBM® (Armonk, NY), various database products available from ORACLE® Corporation (Redwood Shores, CA), MICROSOFT ACCESS® or MICROSOFT SQL SERVER® by MICROSOFT® Corporation (Redmond, Washington), MYSQL® by MySQL AB (Uppsala, Sweden), MONGODB®, Redis, Apache Cassandra®, HBASE® by APACHE®, MapR-DB by the MAPR® corporation, or any other suitable database product. Moreover, any database may be organized in any suitable manner, for example, as data tables or lookup tables. Each record may be a single file, a series of files, a linked series of data fields, or any other data structure.

As used herein, data may refer to partially or fully structured, semi-structured, or unstructured data sets including "big data," which may include millions of rows and hundreds of thousands of columns.

Association of certain data may be accomplished through any desired data association technique such as those known or practiced in the art. For example, the association may be accomplished either manually or automatically. Automatic association techniques may include, for example, a database search, a database merge, GREP, AGREP, SQL, using a key field in the tables to speed searches, sequential searches through all the tables and files, sorting records in the file according to a known order to simplify lookup, and/or the like. The association step may be accomplished by a database merge function, for example, using a "key field" in pre-selected databases or data sectors. Various database tuning steps are contemplated to optimize database performance. For example, frequently used files such as indexes may be placed on separate file systems to reduce In/Out ("I/O") bottlenecks.

One skilled in the art will also appreciate that, for security reasons, any databases, systems, devices, servers, or other components of the system may consist of any combination thereof at a single location or at multiple locations, wherein each database or system includes any of various suitable security features, such as firewalls, access codes, encryption, decryption, public and private keys, and/or the like.

As used herein, a "script" refers to instructions for a computing device to carry out one or more tasks automatically. As used herein, the term "network" includes any cloud, cloud computing system, or electronic communications system or method which incorporates hardware and/or software components. Communication among the parties may be accomplished through any suitable communication channels, such as, for example, a telephone network, an extranet, an intranet, internet, personal internet device, online communications, satellite communications, off-line communications, wireless communications, transponder communications, local area network (LAN), wide area network (WAN), virtual private network (VPN), networked or linked devices, keyboard, mouse, and/or any suitable communication or data input modality. Moreover, although the system may be described herein as being implemented with TCP/IP communications protocols, the system may also be implemented using IPX, APPLETALK®, IPV6, NetBIOS, any tunneling protocol (e.g. IPsec, SSH, etc.), or any number of existing or future protocols. If the network is in the nature of a public network, such as the internet, it may be advantageous to presume the network to be insecure and open to eavesdroppers. Specific information related to the protocols, standards, and application software utilized in connection with the internet is generally known to those skilled in the art and, as such, need not be detailed herein.

"Cloud" or "Cloud computing" or "cloud computing infrastructure" includes a model for enabling convenient, on-demand network access to a shared pool of configurable computing resources (e.g., networks, servers, storage, applications, and services) that can be rapidly provisioned and released with minimal management effort or service provider interaction. Cloud computing may include location-independent computing, whereby shared servers provide resources, software, and data to computers and other devices on demand. Reference to a "device" or processor or memory or the like may include cloud resources, non-cloud resources, or combinations of cloud and non-cloud resources.

Computer programs (also referred to as computer control logic) are stored in main memory and/or secondary memory. Computer programs may also be received via communications interface. These computer program instructions may be loaded onto a general purpose computer, special purpose computer, controller, or other programmable data processing apparatus to produce a machine, such that the instructions that execute on the computer or other programmable data processing apparatus create means for implementing the functions specified in the flowchart block or blocks. These computer program instructions may also be stored in a computer-readable memory that can direct a computer, controller, or other programmable data processing apparatus to function in a particular manner, such that the instructions stored in the computer-readable memory produce an article of manufacture including instruction means which implement the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus provide steps for implementing the functions specified in the flowchart block or blocks.

In various embodiments, software may be stored in a computer program product and loaded into a computer system using a removable storage drive, hard disk drive, or communications interface. The control logic (software), when executed by the processor or controller, causes the processor or controller to perform the functions of various embodiments as described herein. In various embodiments, hardware components may take the form of application specific integrated circuits (ASICs). Implementation of the hardware so as to perform the functions described herein will be apparent to persons skilled in the relevant art(s).

As will be appreciated by one of ordinary skill in the art, the system may be embodied as a customization of an existing system, an add-on product, a processing apparatus executing upgraded software, a stand-alone system, a distributed system, a method, a data processing system, a device for data processing, and/or a computer program product. Accordingly, any portion of the system or a module may take the form of a processing apparatus executing code, an internet based embodiment (e.g., an internet-based driving command system), an entirely hardware embodiment, or an embodiment combining aspects of the internet, software, and hardware. Furthermore, the system may take the form of a computer program product on a computer-readable storage medium having computer-readable program code means embodied in the storage medium. Any suitable computer-readable storage medium may be utilized, including hard disks, solid state storage media, CD-ROM, BLU-RAY DISC®, optical storage devices, magnetic storage devices, and/or the like.

The system and method may be described herein in terms of functional block components, screen shots, optional selections, and various processing steps. It should be appreciated that such functional blocks may be realized by any number of hardware and/or software components configured to perform the specified functions. For example, the system may employ various integrated circuit components, e.g., memory elements, processing elements, logic elements, look-up tables, and the like, which may carry out a variety of functions under the control of one or more microprocessors or other control devices. Similarly, the software elements of the system may be implemented with any programming or scripting language such as C, C++, C #, JAVA®, JAVASCRIPT®, JAVASCRIPT® Object Notation (JSON), VBScript, Macromedia COLD FUSION, COBOL, MICROSOFT® company's Active Server Pages, assembly, PERL®, PHP, awk, PYTHON®, Visual Basic, SQL Stored Procedures, PL/SQL, any UNIX® shell script, and extensible markup language (XML) with the various algorithms being implemented with any combination of data structures, objects, processes, routines or other programming elements. Further, it should be noted that the system may employ any number of techniques for data transmission, signaling, data processing, network control, and the like. Still further, the system could be used to detect or prevent security issues with a client-side scripting language, such as JAVASCRIPT®, VBScript, or the like.

The system and method are described herein with reference to screen shots, block diagrams and flowchart illustrations of methods, apparatus, and computer program products according to various embodiments. It will be understood that each functional block of the block diagrams and the flowchart illustrations, and combinations of functional blocks in the block diagrams and flowchart illustrations, respectively, can be implemented by computer program instructions.

In various embodiments, components, modules, and/or engines of the systems may be implemented as applications or apps. Apps are typically deployed in the context of a mobile operating system, including for example, a WINDOWS® mobile operating system, an ANDROID® operating system, an APPLE® iOS operating system, a BLACKBERRY® company's operating system, and the like. The app may be configured to leverage the resources of the larger operating system and associated hardware via a set of predetermined rules which govern the operations of various operating systems and hardware resources. For example, where an app desires to communicate with a device or network other than the mobile device or mobile operating system, the app may leverage the communication protocol of the operating system and associated device hardware under the predetermined rules of the mobile operating system. Moreover, where the app desires an input from a user, the app may be configured to request a response from the operating system which monitors various hardware components and then communicates a detected input from the hardware to the app.

Accordingly, functional blocks of the block diagrams and flowchart illustrations support combinations of means for performing the specified functions, combinations of steps for performing the specified functions, and program instruction means for performing the specified functions. It will also be understood that each functional block of the block diagrams and flowchart illustrations, and combinations of functional blocks in the block diagrams and flowchart illustrations, can be implemented by either special purpose hardware-based computer systems which perform the specified functions or steps, or suitable combinations of special purpose hardware and computer instructions. Further, illustrations of the process flows, and the descriptions thereof may make reference to user WINDOWS®/LINUX®/UNIX® applications, webpages, websites, web forms, prompts, etc. Practitioners will appreciate that the illustrated steps described herein may comprise, in any number of configurations, including the use of WINDOWS®/LINUX®/UNIX® applications, webpages, web forms, popup WINDOWS®/LINUX®/UNIX® applications, prompts, and the like. It should be further appreciated that the multiple steps as illustrated and described may be combined into single webpages and/or WINDOWS®/LINUX®/UNIX® applications but have been expanded for the sake of simplicity. In other cases, steps illustrated and described as single process steps may be separated into multiple webpages and/or WINDOWS®/LINUX®/UNIX® applications but have been combined for simplicity.

The computers discussed herein may provide a suitable website or other internet-based graphical user interface (GUI) which is accessible by users. In one embodiment, MICROSOFT® company's Internet Information Services (IIS), Transaction Server (MTS) service, and an SQL SERVER® database, are used in conjunction with MICROSOFT® operating systems, WINDOWS NT® web server software, SQL SERVER® database, and MICROSOFT® Commerce Server. Additionally, components such as ACCESS® software, SQL SERVER® database, ORACLE® software, SYBASE® software, INFORMIX® software, MYSQL® software, INTERBASE® software, etc., may be used to provide an Active Data Object (ADO) compliant database management system. In one embodiment, the APACHE® web server is used in conjunction with a LINUX® operating system, a MYSQL® database, and PHP, Ruby, and/or PYTHON® programming languages.

The term "non-transitory" is to be understood to remove only propagating transitory signals per se from the claim scope and does not relinquish rights to all standard computer-readable media that are not only propagating transitory signals per se. Stated another way, the meaning of the term "non-transitory computer-readable medium" and "non-transitory computer-readable storage medium" should be construed to exclude only those types of transitory computer-readable media which were found in In re Nuijten to fall outside the scope of patentable subject matter under 35 U.S.C. § 101.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching may be used throughout the figures to denote different parts but not necessarily to denote the same or different materials.

Methods, systems, and articles are provided herein. In the detailed description herein, references to "one embodiment," "an embodiment," "various embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f) unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for interleaved flow-sensitive dephasing (FSD) in 3D turbo spin-echo (TSE), the method comprising:

applying, via a sequence controller and through one or more radio-frequency coils, a 90-degree excitation radio-frequency pulse at a beginning of each time of repetition (TR);

applying, via the sequence controller and through the one or more radio frequency coils, a 180-degree radio-frequency pulse only once per TR;

applying, via the sequence controller and through the one or more gradient amplifiers, a pair of identical unipolar FSD gradient pulses symmetrically about the 180-degree radio-frequency pulse in both phase-encoding (denoted as y) and partition-encoding (denoted as z) axes to generate flow sensitivity along both axes (y and z), leading to net flow sensitivity along their sum vector;

applying, via the sequence controller and through the one or more radio-frequency coils, a conventional 3D TSE refocusing radio-frequency pulse train and corresponding encoding and readout gradients to subsequently generate a series of spin echoes within the current TR;

receiving radio-frequency signals by sampling individual spin echoes of the series of spin echoes;

repeating the above steps in a next TR while toggling the polarity of the FSD gradient pulses along only one of the phase-encoding axis or the partition-encoding axis to generate flow sensitivity in a new direction orthogonal to that in the previous TR; and repeating the above steps, with the polarity toggled along the same axis, to achieve signal suppression of any flow in a two-dimensional space defined by the phase-encoding and partition-encoding axes while receiving all imaging data for final 3D image reconstruction, wherein flowing blood signals are suppressed while preserving tissue signal intensity and T1-weighted contrast because of the execution of short-duration FSD gradient pulses.

2. The method of claim 1, wherein the pair of identical unipolar FSD gradient pulses is applied in the phase-encoding axis symmetrically about the 180-degree radio-frequency pulse to generate flow sensitivity, measured by first gradient moment, $m_1$, along that axis.

3. The method of claim 2, wherein the pair of identical unipolar gradient pulses is simultaneously applied in the partition-encoding axis symmetrically about the 180-degree radio-frequency pulse to generate flow sensitivity along that axis.

4. The method of claim 3, wherein the pair of identical unipolar FSD gradient pulses simultaneously applied in the two axes (y and z) generate the net flow sensitivity along their sum vector of $m_1$ in +y axis and $m_1$ in +z axis.

5. The method of claim 1, wherein the toggling the polarity of the FSD gradient pulses takes place along only one of the phase-encoding axis or the partition-encoding axis in the next TR to generate flow sensitivity in an opposite direction.

6. The method of claim 5, wherein in response to the toggling the polarity of the FSD gradient pulses, the net flow sensitivity is reoriented along the sum vector of $m_1$ in −y axis and $m_1$ in +z axis.

7. The method of claim 1, wherein the FSD gradient pulse's polarity toggling occurs in all successive TRs and in the same axis, resulting in the net flow sensitivity to toggle between two orthogonal directions within the y-z plane and reducing directional dependence of blood flow suppression.

8. The method of claim 7, wherein the method effectively suppresses signals of multidirectional or tortuous blood flow, better than conventional blood flow signal suppression methods that exert unidirectional flow signal suppression.

9. The method of claim 1, further comprising generating an MRI image.

10. The method of claim 9, wherein the MRI image is a T1-weighted image.

11. The method of claim 9, wherein the method preserves T1 contrast weighting and tissue signal-to-noise ratio better than conventional blood flow suppression methods because of the less T2 decay and magnetization transfer effect.

* * * * *